United States Patent [19]

Numai

[11] Patent Number: 5,084,897
[45] Date of Patent: Jan. 28, 1992

[54] OPTICAL FILTER DEVICE

[75] Inventor: Takahiro Numai, Tokyo, Japan

[73] Assignee: NEC Corporation, Tokyo, Japan

[21] Appl. No.: 343,553

[22] Filed: Apr. 27, 1989

Related U.S. Application Data

[63] Continuation-in-part of Ser. No. 125,287, Nov. 25, 1987, abandoned.

[30] Foreign Application Priority Data

Nov. 26, 1986 [JP] Japan .................. 61-279779

[51] Int. Cl.$^5$ .................. H01S 3/08; H01S 3/19; G02F 1/01
[52] U.S. Cl. .................. 372/96; 372/50; 359/240
[58] Field of Search .................. 372/96, 50, 47, 48, 372/49; 350/353

[56] References Cited

U.S. PATENT DOCUMENTS

| | | | |
|---|---|---|---|
| 4,575,851 | 3/1986 | Seki et al. | 372/50 |
| 4,719,636 | 1/1988 | Yamaguchi et al. | 372/50 |
| 4,720,835 | 1/1988 | Akiba et al. | 372/96 |
| 4,744,089 | 5/1988 | Montroll et al. | 372/96 |
| 4,856,005 | 8/1989 | Oe et al. | 372/96 |
| 4,899,361 | 2/1990 | Numai | 372/96 |

FOREIGN PATENT DOCUMENTS 0189981 9/1985 Japan .................. 372/96

*Primary Examiner*—Eugene R. LaRoche
*Assistant Examiner*—Evelyn A. Lester
*Attorney, Agent, or Firm*—Sughrue, Mion, Zinn, Macpeak & Seas

[57] ABSTRACT

An optical filter device comprises a distributed feedback region and an active region which are arranged in series and coupled optically, and anti-reflection structures which are positioned at both ends of the distributed feedback region and active region thus coupled to be in contact therewith so that a predetermined wavelength of an optical signal is selected from optical signals of, for instance, as much as 60 channels so that a wavelength selection can be performed in a narrow bandwidth of less than approximately 1 to 2 Å and in a wide tuning range of an optical signal wavelength in accordance with a carrier injection thereinto.

4 Claims, 5 Drawing Sheets

OPTICAL FILTER DEVICE

This is a continuation-in-part of U.S. patent application Ser. No. 07/125,287 filed Nov. 25, 1987, abandoned.

FIELD OF THE INVENTION

The invention relates to an optical filter device, and more particularly to an optical filter device in which a predetermined wavelength of an optical signal is selected from wavelength division multiplexed optical signals.

BACKGROUND OF THE INVENTION

One of conventional optical filter devices includes an optical distributed feedback structure provided in an optical amplifying device which utilizes a semiconductor active layer. In the optical filter device, a variable tuning of a predetermined wavelength which is selected from wavelength division multiplexed optical signals can be performed by changing a carrier density injected into the active layer. Further, the optical filter device is of a transmission type which is well adapted to a higher integration. For these reasons, the optical filter device is expected to be applied to a wide practical use. Especially, a distributed feedback structure having a diffraction grating is more advantageous in regard to properties of the wavelength selection and integration for the optical feedback structure than a Fabry Perot resonator having cleaved facets. Such an optical filter device as using the distributed feedback structure has been proposed on pages 123 to 126 of "Optics Communications", Volume 10, No. 2, February 1974, and theoretical studies thereof have been made therein.

As a further conventional optical filter having no optical gain, an optical filter including a $\lambda/4$ shifted diffraction grating provided after the growth of an optical guide layer on a semiconductor substrate has been proposed. The $\lambda/4$ shifted diffraction grating is a diffraction grating in which a phase thereof is deviated in the vicinity of the center position by $\lambda/4$, where $\lambda$ is a wavelength of light transmitted therethrough. The feature of this optical filter is to provide a transmission wavelength band of a narrow width less than 1 to 2 Å in the vicinity of Bragg wavelength. This type of an optical filter is described on pages 125 to 127 of "Applied Physics Letters", Vol. 49, 1986 by R. C. Alferness et al.

Such an optical filter device as the former and latter optical filter devices described above has a function in which a predetermined wavelength of an optical signal is selected from wavelength division multiplexed optical signals, so that the optical filter device plays an important role in such a wide use as in an optical communication system, optical switching apparatus, and optical signal processing, etc. Accordingly, it is strongly desired that the satisfactory selection of a wavelength and wide variable tuning range of a wavelength selection are obtained in the optical filter device. Further, it is indispensable that the optical filter device is of a structure of an optical integrated circuit. Therefore the optical filter device is required to be of a transmission type in which only a predetermined wavelength of an optical signal is transmitted therethrough.

However, the following disadvantages occur in optical filters previously proposed and studied in the art. First of all, the optical filter explained in the aforementioned "Optics Communications" article will be discussed. The optical filter comprises an optical guide layer for guiding light and an active layer for amplifying light, respectively, grown on a distributed feedback structure including a diffraction grating by crystal growth. A bandgap energy of the optical guide layer is larger than an energy of a transmission light wavelength, and a bandgap energy of the active layer is proximate to the transmission light wavelength energy. When current is injected into the optical filter, effective refractive index $n_o$ lowers due to the increase of carrier density. This is widely known as "plasma effect". The wavelength $\lambda$ of light which is selected in the optical filter is defined in the following equation.

$$\lambda = 2n_o \Lambda$$

where $\Lambda$ is a pitch of the diffraction grating. Therefore, the wavelength $\lambda$ to be selected is controlled to vary by changing the effective refractive index $n_o$ in accordance with the current injection. When current is injected into the active layer for the tuning of the selected wavelength, optical gain of the selected wavelength is increased and the wavelength selectively becomes sharp. On the contrary, where the injected current is increased up to a level more than a certain current value, laser oscillation is induced in the device. That is, the device is no longer an optical filter, but is a distributed feedback laser. In order that the device is used for an optical filter, injected current must be less than a threshold current for laser oscillation, and concurrently must be more than a predetermined current by an amount which is enough that a desirable wavelength selectivity is attained. Accordingly, a current range to be supplied to the device is limited, resulting in a limited tuning range. Consequently, the optical filter is only applied to an optical communication system having several channels.

On the other hand, in the optical filter described in the "Applied Physics Letters" article by Alferness et al., explained above, it is impossible to vary transmission light wavelength.

SUMMARY OF THE INVENTION

Accordingly, it is an object of the invention to provide an optical filter device in which a large tuning range of a wavelength and optical gain for a transmission wavelength are obtained.

It is a further object of the invention to provide an optical filter device in which a predetermined wavelength of an optical signal is selected from wavelength division multiplexed optical signals of as much as 60 channels.

It is still a further object of the invention to provide an optical filter device in which a ratio of an optical signal in regard to noise signals which is decreased by the natural radiation light is prevented from occurring.

According to the invention, an optical filter device comprises a distributed feedback region having a $\lambda/4$ shifted structure and an optical amplifying region arranged in series, wherein the distributed feedback region and the optical amplifying region are optically coupled to each other. In the optical filter device, anti-reflection structures of a window structure are provided on both sides thereof. In order to increase a varying tunable range of wavelength selection in accordance with "plasma effect", a range of injected current must be large. For this purpose, the optical filter device must be of a structure in which no laser oscillation is induced, even if injected current is increased up to a non-limited extent. In the optical filter device of the invention, there are integrated in series a filter portion having a wavelength selecting function and no optical gain, and an optical amplifying portion having an optical amplifying function and no wavelength selecting function. The anti-reflection structure is provided on both sides thereof, wherein the filter portion includes the distributed feedback structure having the diffraction grating, and the optical amplifying portion includes no diffraction grating.

The reason why laser oscillation is induced in an optical device is that resonance occurs in an amplifying medium. The resonance is produced in accordance with reflection on both sides of the amplifying medium, or in the presence of a distributed feedback region of a diffraction grating, etc., in the amplifying medium. Further, where a reflectivity on facets of the amplifying medium is high, resonance can be produced between the facets and the diffraction grating of the filter portion.

In the optical filter device of the invention, both facets thereof are of an anti-reflection structure, and the optical amplifying portion includes no diffraction grating, so that no resonance of light is produced in the optical amplifying portion. Therefore, no laser oscillation is induced in the optical filter device according to the invention. This means that there is no limitation in a range of injected current, which is limited in a conventional optical filter device due to laser oscillation therein. Further, an optical guide layer in the filter portion has no gain relative to a transmission light wavelength, so that no laser oscillation occurs in the vicinity of the transmission light wavelength by injecting current thereinto. Therefore, there is also no limitation in current injected into the filter portion. As explained above, an optical filter device in which a wide range of injected current and a wide tunable range of wavelength variation are obtained is provided in the invention.

BRIEF DESCRIPTION OF THE DRAWINGS

The invention will be described in more detail in conjunction with the following drawings wherein.

DESCRIPTION OF THE PREFERRED EMBODIMENTS

Figure 1:
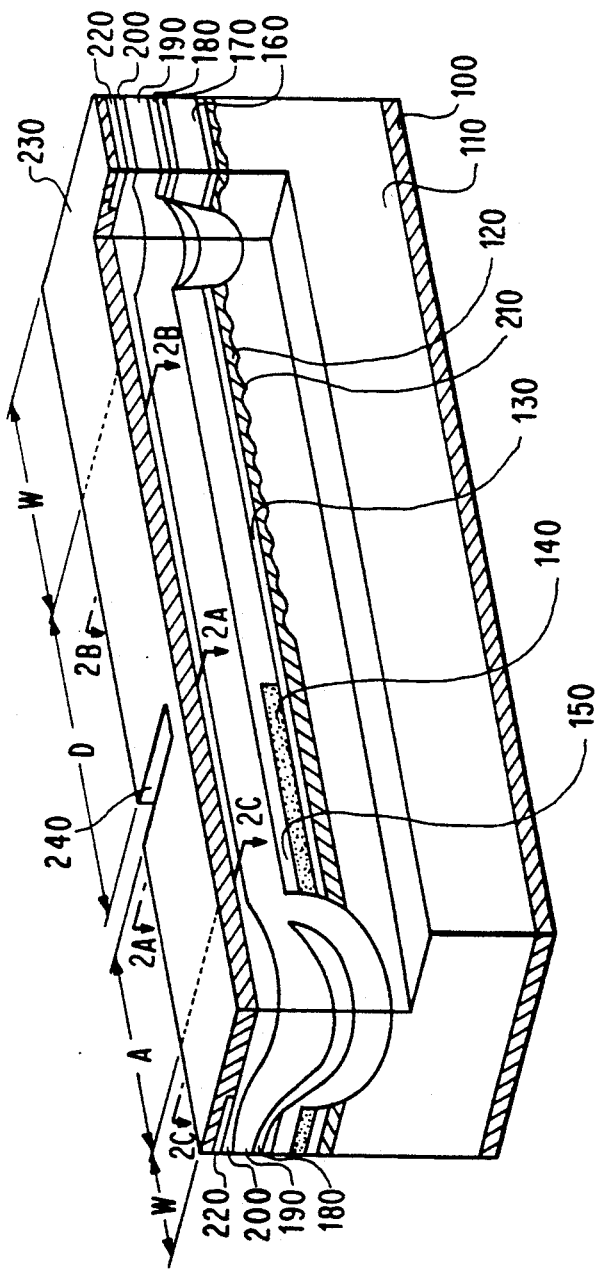
FIG. 1 is a partially cut perspective view showing an optical filter device in an embodiment according to the invention.

In FIG. 1, there is shown an optical filter device in an embodiment according to the invention. The optical filter device comprises a substrate 110 of InP, an optical guide layer 120 of non-doped InGaAs, a buffer layer 130 of n-InP, a non-doped active layer 140, a cladding layer 150 of p-InP, a cladding layer 160 of p-InP, a p-InP layer 170, an n-InP layer 180, a p-InP layer 190, an InGaAsP layer 200, an oxidation film layer 220 of $SiO_2$, and electrodes 100 and 230, respectively provided on the upper surface of the oxidation film layer 220 and the back surface of the substrate 110.

In the optical filter device, a distributed feedback region D, an optical amplifying region A, and window regions W are defined respectively wherein a groove 240 is formed between the distribution feedback region D and optical amplifying region A. In the distributed feedback region D, a $\lambda/4$ shifted diffraction grating having a $\lambda/4$ shift position 210 and a period of, for instance, 2400 Å is formed on the substrate 110 wherein phases are deviated in the center position 210 by $\lambda/4$, where $\lambda$ is a wavelength propagated therein. Therefore, concave and convex shapes are reversed on both sides of the shift position 210 in a primary diffraction grating because a period thereof is $\lambda/2$.

Figure 2A:
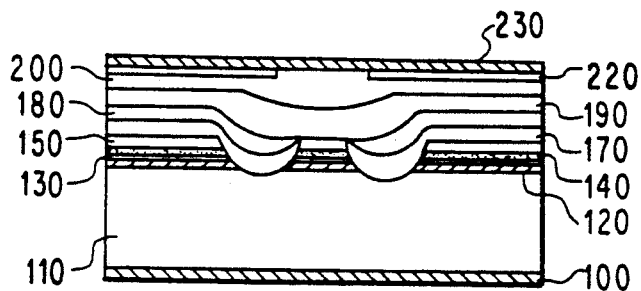
FIGS. 2A to 2C are cross-sectional views respectively cut along the lines 2A—2A to 2C—2C in FIG. 1.
Figure 2B:
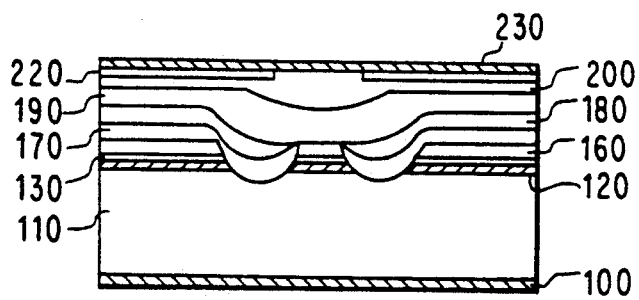
Figure 2C:
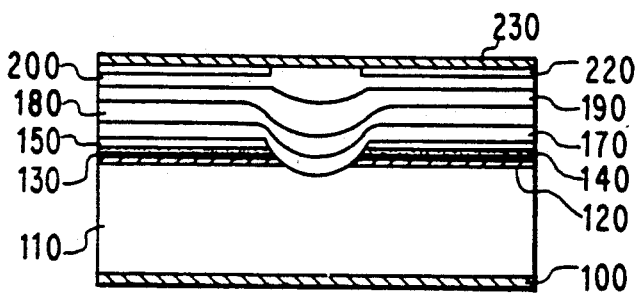

In FIG. 2A, the cross section of the optical amplifying region A is shown to be cut along the line 2A—2A in FIG. 1 wherein like parts are indicated by like reference numerals. Further, the cross sections of the distributed feedback region D and window region W are shown in FIGS. 2B and 2C to be cut along the lines 2B—2B and 2C—2C in FIG. 1, respectively wherein like parts are also indicated by like reference numerals.

The optical filter device described above is fabricated as follows.

At first, the $\lambda/4$ shifted diffraction grating having the shift position 210 is provided on a region corresponding to the distributed feedback region D of the InP substrate 110. Next, the non-doped InGaAs optical guide layer 120 having a thickness of 0.3 $\mu$m and $\lambda g$ of 1.3 $\mu$m, the n-InP buffer layer 130 having a thickness of 0.1 $\mu$m, the non-doped active layer 140 having a thickness of 0.1 $\mu$m and $\lambda g$ of 1.53 $\mu$m, and the p-InP cladding layer 150 having a thickness of 0.2 $\mu$m are sequentially formed by a first process of liquid phase epitaxial growth. Thereafter, the active layer 140 and InP cladding layer 150 are selectively removed in portions corresponding to the distributed and window regions D and W. Then, the p-InP cladding layer 160 is formed on an overall area by a second process of liquid phase epitaxial growth. After etching process is then performed to prepare the formation of a buried structure and window structures, the buried structure is provided to form the window regions W by a third process of liquid phase epitaxial growth wherein the buried heterostructure is of a double channel planar buried heterostructure. Finally, the electrodes 100 and 230 are provided on the upper surface of the growth layers and back surfaces of the substrate 110, respectively, and the groove 240 is provided to be of 20 $\mu$m in its width except a region in the vicinity of a center mesa between the optical amplifying region A and distributed feedback region D. The window regions W, optical amplifying region A, and distributed feedback region D are 30 $\mu$m, 100 $\mu$m, and 500 $\mu$m in length, respectively.

Figure 3A:
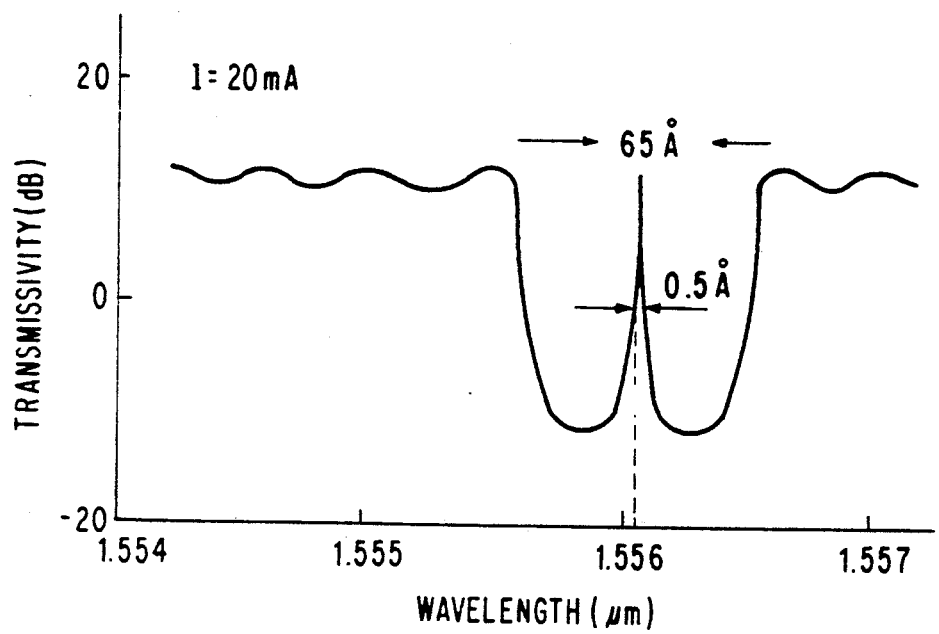
FIGS. 3A and 3B are explanatory diagrams showing a wavelength shift by changing an injection current in the embodiment according to the invention.
Figure 3B:
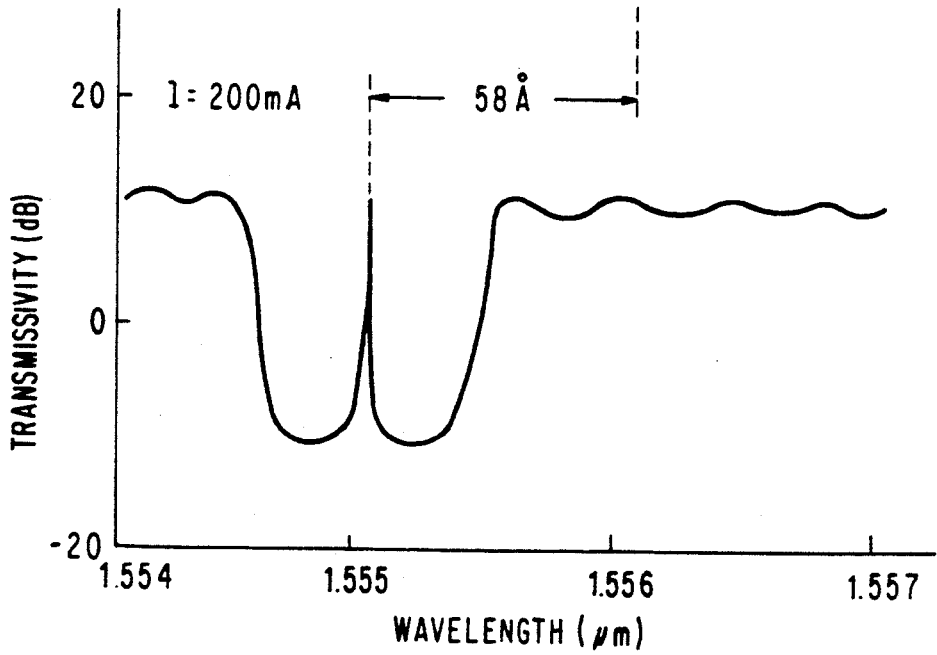

The transmission property of the optical filter device thus fabricated is explained in FIGS. 3A and 3B.

When electric current to be injected into the optical filter device is changed from 20 mA to 200 mA, an extinction ratio of more than 20 dB is obtained, and a 10 dB down bandwidth for a transmission wavelength is 0.5 Å. Where the injected current is 20 mA, a transmission wavelength is 1.5563 $\mu$m as shown in FIG. 3A. Where the injected current is 200 mA, a transmission wavelength is 1.5505 $\mu$m as shown in FIG. 3B. In the control of the injected current, a transmission wavelength is successively changed in a range of 58 Å, and a stopband is 65 Å as shown therein. The depth of the diffraction grating is 800 Å.

According to the transmission property of the optical filter device in the invention, it is understood that a predetermined wavelength of an optical signal can be selected from optical signals of 60 channels to be propagated by an interval of 0.5 Å in a range of 30 Å which is approximately half of the stopband.

Although the optical filter device in the embodiment according to the invention is explained, other semiconductor or dielectric material may be used in place of the material as described above. Further, an optical waveguide structure may be of another type of a structure other than a planar structure or buried structure. In this respect, for instance, a surface type structure in which a light is transmitted vertically in regard to multi-layers may be adopted. Still further, a surface type structure in which layers having different refractive indexes are provided alternately may be used in the distributed feedback structure in place of a structure in which a diffraction grating is provided on an optical waveguide. Otherwise, if an anti-reflection coating is provided on both facets of the optical filter device, a coupling efficiency of an incident light supplied to the optical filter device is increased so that the characteristic thereof is much improved.

As clearly understood from the optical filter device in the embodiment according to the invention, an operation of an optical filter device according to the invention will be explained below.

In an optical transmission property of an optical waveguide having a distributed feedback structure in which no gain is obtained in a transmission wavelength band, a stopband is formed with a width of approximately several tens Å in the center of which Bragg wavelength to be defined by an optical period of a diffraction grating therein is located when optical phases are aligned in a distributed feedback region. In a case where the optical phases are deviated by $\pi$ on the both sides in the center of the distributed feedback region, the stop wavelength band of approximately several tens Å is divided into two bands so that a narrow bandwidth of approximately one to two Å is provided between the two bands to transmit an optical signal in the center of the above mentioned stopband. In other words, a pitch of the diffraction grating is deviated by $\lambda/4$. where is a wavelength which is propagated in the optical filter device. Therefore, this is called "a $\lambda/4$ shifted structure". If an optical waveguide which is provided with a distributed feedback region having the $\lambda/4$ shifted structure is fabricated by a semiconductor of a composition which is on the side of a shorter wavelength than a transmission wavelength, there is produced no gain therein so that a wavelength selection can be performed in a narrow width of less than approximately 1 to 2 Å and in a much wider band in the center of Bragg wavelength by injecting carriers thereinto, and the deterioration of a ratio of an optical signal in regard to noise signals due to a natural radiation light is prevented from occurring.

For the purpose of providing an optical filter device having an amplifying function, further, an active region and distributed region are coupled optically because the above mentioned optical waveguide layer has no gain. That is to say, an optical filter device having an amplifying function is obtained, if a construction in which a light is supplied to the active region to be amplified therein, and then transmitted through the distributed feedback region is provided. In this point, attention must be paid to the construction that the optical filter device must be of anti-reflection structure at both facets. This is a reason why oscillation occurs in the optical filter device to result in a distributed feedback type laser, unless such an anti-reflection structure is provided therein. The anti-reflection structure is obtained by providing a window structure or by coating SiN film on both facets. In a practical use, the window structure is preferable to refrain a reflection from being occurred thereon reliably.

Figure 4:
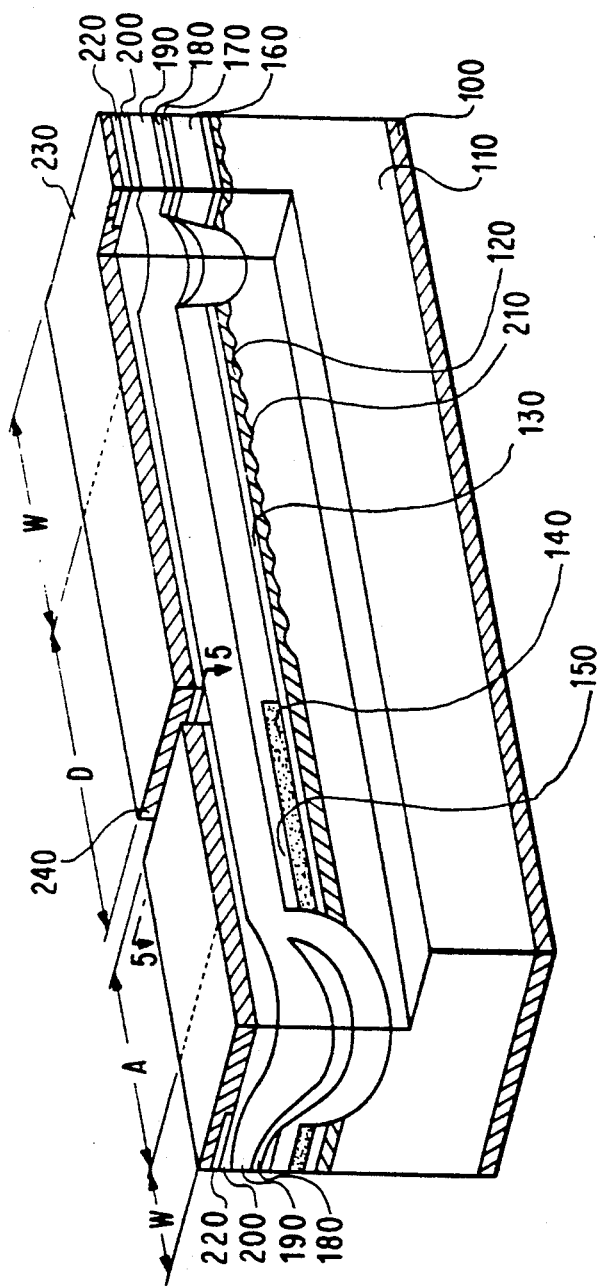
FIG. 4 is a partially cut perspective view showing an optical filter device in a further embodiment according to the invention.
Figure 5:
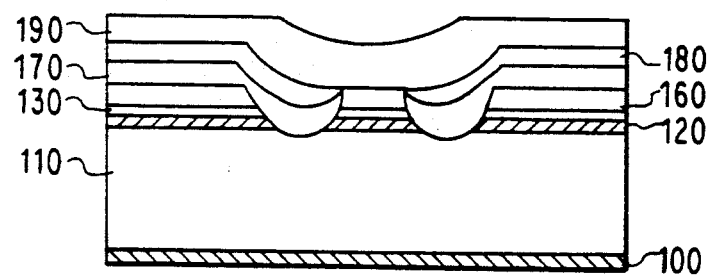
FIG. 5 is a cross-section view cut along line 5 in FIG. 4.

FIGS. 4 and 5 show an optical filter device in a further embodiment according to the invention, wherein like parts are indicated by like reference numerals in FIGS. 1 and 2A to 2C. The difference between the former embodiment and the present embodiment is that a groove 240 is provided between an optical amplifying region A and a distributed feedback region D to divide an electrode 230 into separated portions and to remove an $SiO_2$ film 220 and an InGaAsP cap layer 200 at a portion corresponding to the groove 240. This is clearly illustrated in FIG. 5. The cap layer 200 is provided to increase electric coupling between the electrode 230 and the semiconductor layers except for a boundary region between the optical amplifying region A and the distributed feedback region D. Therefore, the two regions A and D are electrically separated to provide an electric resistance of more than several hundred ohms therebetween. Consequently, current flows independently between the two regions A and D, thereby making it possible to control a wavelength selection and an optical gain independently.

In operation, wavelength of more than 50 Å is varied in accordance with the change of current from 0 to 80 mA injected into the distributed feedback region D. In regard to light of the wavelength thus varied, light transmissivity can be arbitrarily set at 0 to 20 dB in accordance with the change of current from 20 to 120 mA injected into the optical amplifying region A.

As understood from the further embodiment, the optical amplifying region A and the distributed feedback region D are electrically separated with the provision of the groove 240, so that a wavelength selection and an optical gain are independently controlled. Therefore, the degree of freedom is increased in using the optical filter device, as compared to the former embodiment.

Although the invention has been described with respect to specific embodiments for complete and clear disclosure, the appended claims are not to be thus limited but are to be construed as embodying all modification and alternative constructions that may occur to one skilled in the art which fairly fall within the basic teaching herein set forth.

What is claimed is:

1. An optical filter device comprising:
   an optical amplifying region provided on a semiconductor substrate for amplifying an input light beam to produce an amplified light beam, said optical amplifying region including an active layer;
   a distributed feedback region provided on said semiconductor substrate, said distributed feedback region including a $\lambda/4$ shift structure and no active layer; and
   anti-reflection structures;
   wherein said optical amplifying region and said distributed feedback region include a common optical guide layer, and are arranged in series to be optically coupled by said common optical guide layer, and one of said anti-reflection structures is positioned at each end plane of the series arrangement of said optical amplifying region and said distributed feedback region thus coupled to be in contact therewith, said distributed feedback region having no gain relative to said amplified light beam and filtering said amplified light beam to produce a selected wavelength component of said amplified light beam.

2. An optical filter device according to claim 1, wherein said optical amplifying region and said distributed feedback region include first and second common electrodes, said first common electrode being partially separated by a groove.

3. An optical filter device according to claim 1, wherein said optical amplifying region and said distributed feedback region are electrically controllable independently of each other.

4. An optical filter device according to claim 3, wherein said optical amplifying region and said distributed feedback region are electrically separated from each other, each of said optical amplifying region and said distributed feedback region having separate electrodes.

* * * * *